United States Patent [19]

Ueda

[11] Patent Number: 5,368,915
[45] Date of Patent: Nov. 29, 1994

[54] ACTIVE MATRIX SUBSTRATE

[75] Inventor: Tohru Ueda, Nara, Japan

[73] Assignee: Sharp Kabushiki Kaisha, Osaka, Japan

[21] Appl. No.: 836,404

[22] Filed: Feb. 18, 1992

[30] Foreign Application Priority Data

Aug. 30, 1991 [JP] Japan .................................. 3-220627

[51] Int. Cl.$^5$ .............................................. H01B 3/12
[52] U.S. Cl. ..................................... 428/209; 361/311;
361/321.2; 361/322; 428/210; 428/469;
428/472; 428/697; 428/699; 428/701; 428/702
[58] Field of Search ............... 428/697, 699, 701, 702,
428/469, 472, 209, 210; 361/311, 321, 322

[56] References Cited

U.S. PATENT DOCUMENTS

| 3,682,766 | 8/1972 | Maher | 428/697 |
| 4,260,663 | 4/1981 | Hagemann et al. | 428/472 |
| 4,309,295 | 1/1982 | McSweeny | 428/697 |
| 4,367,265 | 1/1983 | Yu et al. | 428/701 |
| 4,490,429 | 12/1984 | Tosaki et al. | 428/901 |
| 5,139,856 | 8/1992 | Takeuchi et al. | 428/469 |

FOREIGN PATENT DOCUMENTS 0035098 2/1984 Japan .
0143235 6/1989 Japan .

OTHER PUBLICATIONS

Schwarz et al "Vacuum Deposition by High energy Laser with emphasis on Barium Titanate films" 1969, Jour. of Vacuum Sci & Tech vol. 6, No. 3 pp. 373–378.

Primary Examiner—A.A. Turner
Attorney, Agent, or Firm—Nixon & Vanderhye

[57] ABSTRACT

An active matrix substrate comprising storage capacitors each having an insulating film formed of a single perovskite oxide or a solid solution composed of a plurality of the perovskite oxides. Since the perovskite oxide has a significantly high relative dielectric constant, the area of storage capacitor can be reduced while keeping or increasing the capacitance thereof. Further, the insulating film can be thickened as far as the insulation property thereof is not affected without the capacitance thereof being reduced, thereby preventing leakage current.

7 Claims, 5 Drawing Sheets

ACTIVE MATRIX SUBSTRATE

BACKGROUND OF THE INVENTION

1. Field of the Invention

The present invention relates to an active matrix substrate which is provided with thin film transistors (hereinafter called "TFT") as switching elements and storage capacitors, and is typically used for an active matrix liquid crystal display device.

2. Description of the Prior Art

An active matrix liquid crystal display device comprises an active matrix substrate and a counter substrate which face each other with a liquid crystal layer sandwiched therebetween. A known active matrix substrate is shown in FIGS. 6 and 7, which comprises a plurality of gate buses 3 arranged in parallel and a plurality of source buses 8 arranged in parallel and perpendicular to the gate buses 3, thus forming a matrix.

TFTs 13 are arranged in a matrix on a substrate 1 with each allocated in a pixel area which is defined by the adjacent gate buses 3 and the adjacent source buses 8. The TFT 13 comprises a gate electrode 2 and a source electrode 7 which are connected to the gate bus 3 and the source bus 8, respectively. The TFT 13 also comprises a drain electrode 9 which is connected to a pixel electrode 10. The pixel electrode 10 which is also disposed in each pixel area defines a room for storing liquid crystal together with a counter electrode disposed on the counter substrate. Further, part of the pixel electrode 10 is overlapped with part of the gate bus 3 with an insulating film 5 interposed therebetween so as to form a storage capacitor 12. In this way, the storage capacitors 12 are arranged in a matrix, like TFTs 13, on the substrate 1.

The whole or part of the pixel electrode 10 is open to the outside through an opening of a light shield film disposed on the counter substrate. The open portion of the pixel electrode 10 serves as an effective display portion. The TFTs 13, the gate buses 3, the source buses 8 and the like are covered with the light shield film.

In a display device having an active matrix substrate of the above structure, a high precision display can be achieved by reducing the size of the pixel electrode 10 without lowering the ratio of the open portion of the pixel electrode 10 through the light shield film to the whole area of the substrate, or the aperture. For this purpose, in addition to reducing the size of the pixel electrode 10, it is required to reduce the area on the substrate which is covered with the light shield film. This can be effected, for example, by reducing the widths of the gate bus 3 and the source bus 8 and reducing the sizes of the TFT 13 and the storage capacitor 12.

Reducing the size of the storage capacitor 12 while securing the storage capacitance thereof has been conventionally performed by the following methods:

(a) reducing the thickness of the insulating film 5 of the storage capacitor 12, (b) using a material with a high dielectric constant for the insulating film 5, and (c) increasing an effective area for capacitance by forming a stacked structure for the storage capacitor 12.

However, when the area of the storage capacitor 12 is reduced according to the above methods, the following problems arise, respectively. In the above method (a), when the insulating film 5 is made thin, the distance between the pair of electrodes, that is, the distance between the pixel electrode 10 and the gate bus 3 overlapped with each other with the insulating film 5 interposed therebetween, is shortened, causing the increase of leakage current and the lowered withstand pressure. Therefore, the thickness of the storage capacitor 12 can not be so reduced, and as a result, it is practically not possible to reduce the area of the storage capacitor 12 by this method.

In the above method (b), a material such as $Al_2O_3$ and $Ta_2O_5$ having relative dielectric constants of about 10 and about 30, respectively, may be used. However, the insulating film 5 formed of such a material is inferior in quality and results in a large leakage current, compared with that formed of a material generally used such as SiO and SiN having relative dielectric constants $\epsilon$ of about 4 and about 7, respectively. As a result, the insulating film 5 made of $Al_2O_3$ or $Ta_2O_5$ is required to be thicker than that made of the material generally used. Therefore, this method is not so effective since the effective capacitance can not be increased.

In the above method (c), the area can be reduced by forming a stacked structure for the storage capacitor. However, the manufacturing process of such a stacked structure is complicated, and further since a sharp difference in thickness between the portion of the stacked structure and other portions of the substrate is formed, buses formed over the different thicknesses may be easily cut off.

The objective of the present invention is to solve the above problems and provide an active matrix substrate which comprises a storage capacitor occupying a small area but having a sufficient capacitance, thereby achieving a high precision display.

SUMMARY OF THE INVENTION

The active matrix substrate of this invention, which overcomes the above-discussed and numerous other disadvantages and deficiencies of the prior art, comprises thin film transistors and storage capacitors arranged in a matrix, wherein each of the storage capacitors includes a pair of electrodes facing each other and an insulating film interposed therebetween, and wherein the insulating film is formed of a perovskite oxide expressed by a formula $ABO_3$ where A is a large cation, B is a small cation, and O is oxygen.

Alternatively, the active matrix substrate comprises thin film transistors and storage capacitors arranged in a matrix, wherein each of the storage capacitors includes a pair of electrodes facing each other and an insulating film interposed therebetween, and wherein the insulating film is formed of a solid solution composed of a plurality of perovskite oxides expressed by a formula $ABO_3$ where A is a large cation, B is a small cation, and O is oxygen.

In a preferred embodiment, the large cation is selected from a group of Sr, Ba, Pb, Ca, La and Nd, and the small cation is selected from a group of Ti, Zr, V, Bi, Co and Ir.

In a preferred embodiment, the insulating film is formed by a thin film deposition method.

In a preferred embodiment, one of the pair of electrodes is a pixel electrode and the other is a gate bus.

In a preferred embodiment, the solid solution contains $BaTiO_3$ and $SrTiO_3$.

According to this invention, the insulating film of the storage capacitor is formed of a perovskite oxide having a significantly high relative dielectric constant or a solid solution composed of a plurality of such perovskite oxides. Therefore, the capacitance per unit area is large, allowing the area of the storage capacitor to be reduced while securing a capacitance thereof as large as or larger than the conventional storage capacitor, so as to achieve a high precision display.

Further, the insulating film can be thickened without reducing the capacitance thereof as far as the insulation property thereof is not affected. Therefore, a small-size storage capacitor having no troubles such as the leakage current is realized without the necessity of forming a stacked structure.

By using the active matrix substrate of this invention provided with the above-described storage capacitors, a high precision active matrix liquid crystal display device with a large aperture can be realized.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

Figure 1:
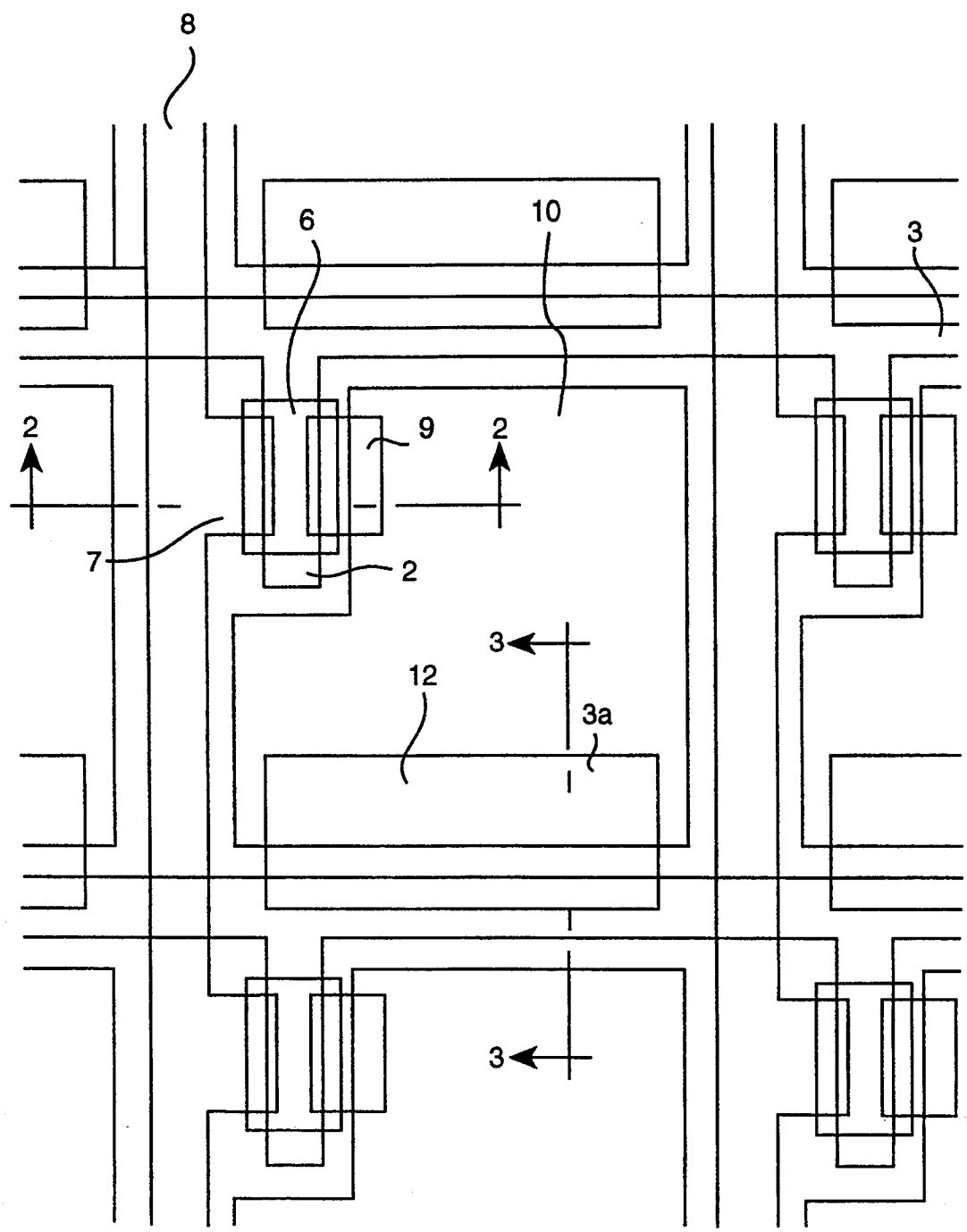
FIG. 1 is a plan view of an active matrix substrate of this invention.
Figure 2:
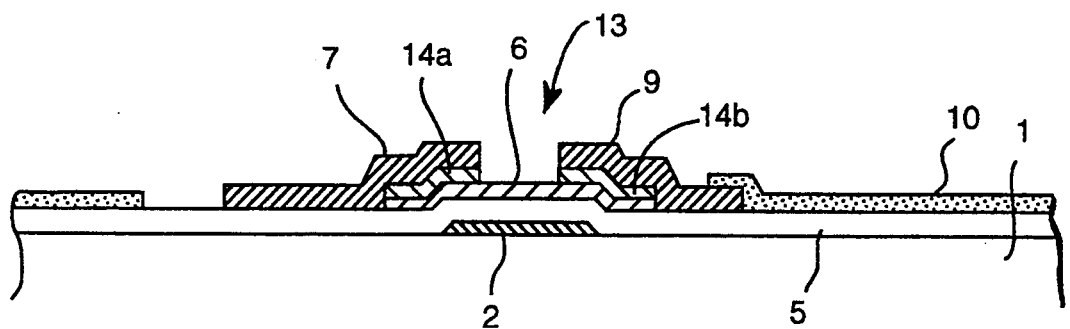
FIG. 2 is a sectional view taken along the line 2—2' of FIG. 1.
Figure 3:
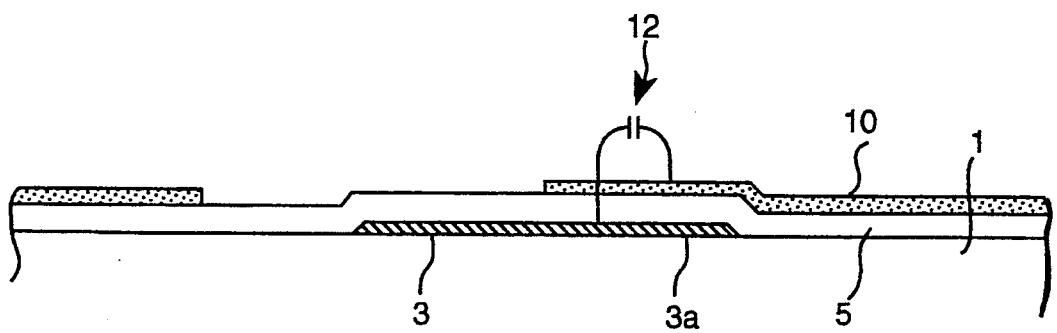
FIG. 3 is a sectional view taken along the line 3—3' of FIG. 1.
Figure 6:
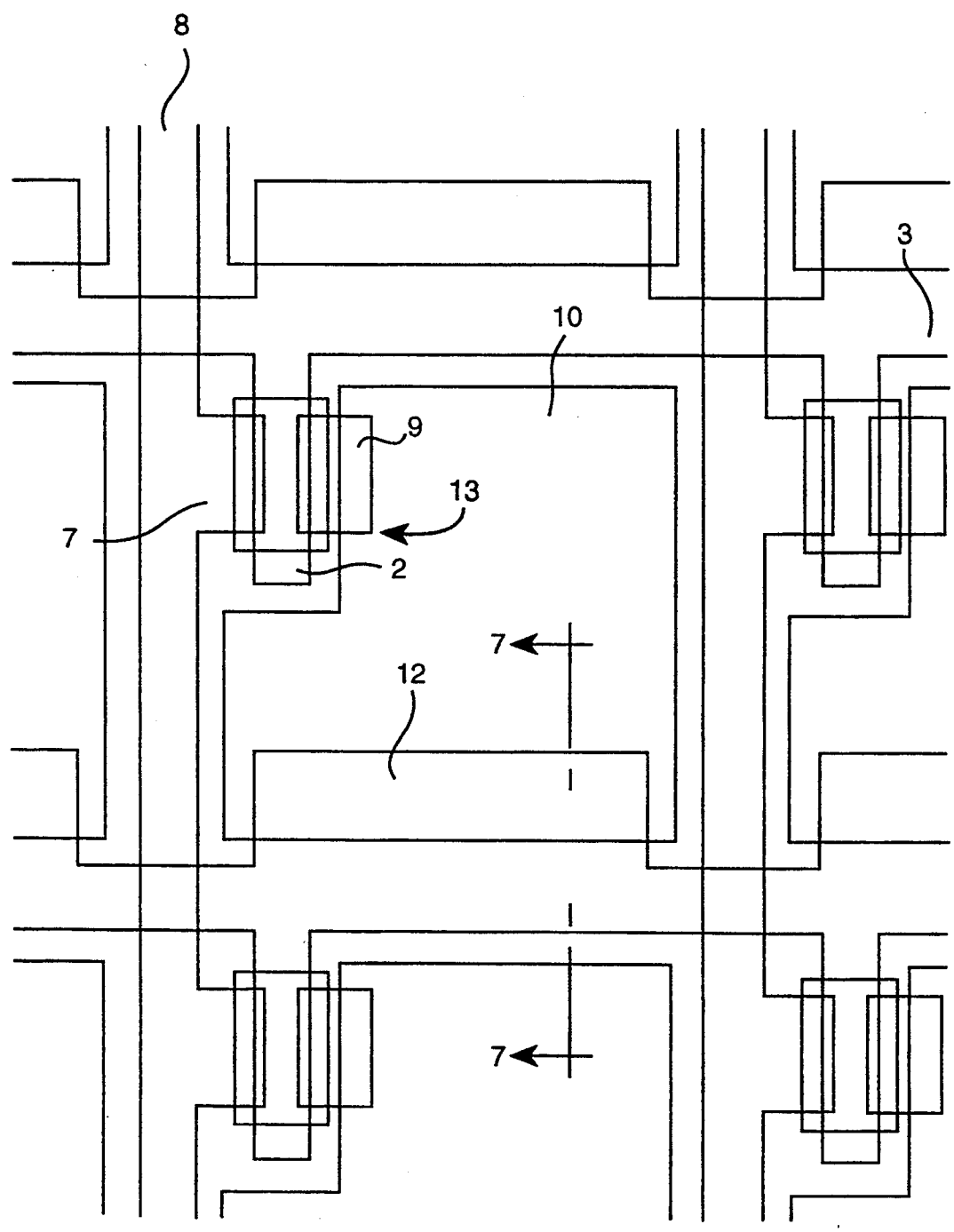
FIG. 6 is a plan view of a known active matrix substrate.
Figure 7:
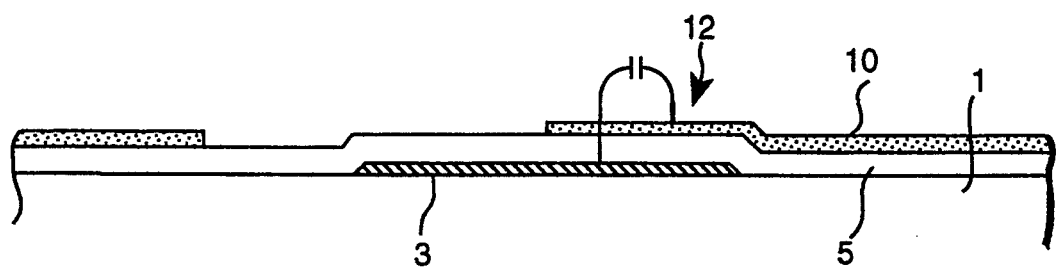
FIG. 7 is a sectional view taken along the line 7—7' of FIG. 6.

An example of the active matrix substrate of the present invention is shown in FIGS. 1, 2 and 3. This active matrix substrate has the same size as the known substrate shown in FIGS. 6 and 7, but the number of the pixel areas has been increased, so as to achieve a high precision display. In other words, the size of a pixel electrode 10 has been reduced so as to increase the number thereof on the same size of the substrate. In FIGS. 1, 2 and 3, the same components are denoted by the same reference numbers as in FIGS. 6 and 7.

In the active matrix substrate of this example, a plurality of gate buses 3 and a plurality of source buses 8 are respectively formed in parallel on an insulating substrate 1 and cross perpendicular to each other. A pixel area which is defined by the adjacent gate buses 3 and the adjacent source buses 8 includes a pixel electrode 10, a TFT 13 and a storage capacitor 12. In short, the pixel electrodes 10, the TFTs 13 and the storage capacitors 12 are formed in a matrix, respectively.

Referring to FIG. 2, the TFT 13 comprises a gate electrode 2, an insulating film 5, and a semiconductor layer 6 formed on the insulating substrate 1 in this order. The TFT 13 also comprises two-divided a-Si films 14a and 14b formed on the semiconductor layer 6, a source electrode 7 formed over the a-Si film 14a and a certain portion of the substrate 1 and a drain electrode 9 formed over the a-Si film 14b and a certain portion of the substrate 1.

The gate electrode 2 is composed of a portion branched from the gate bus 3, and the source electrode 7 is composed of a portion extended from the source bus 8, as shown in FIG. 1. The drain electrode 9 is electrically connected to an edge portion of the pixel electrode 10. Another edge portion of the pixel electrode 10 overlaps a projection 3a extended from the gate bus 3 in the direction parallel to the substrate 1, as shown in FIGS. 1 and 3. The overlapping portion constitutes the storage capacitor 12. In other words, the storage capacitor 12 is composed of the edge portion of the pixel electrode 10 and the projection 3a which is a part of the gate bus 3 facing each other with the insulating film 5 interposed therebetween. The insulating film 5 constituting the storage capacitor 12 is made of a single perovskite oxide or a solid solution of a plurality of perovskite oxides.

In the active matrix substrate including the insulating film 5 made of the above material, the storage capacitor 12 thereof has a remarkably large storage capacitance due to the reason described below.

Figure 5:
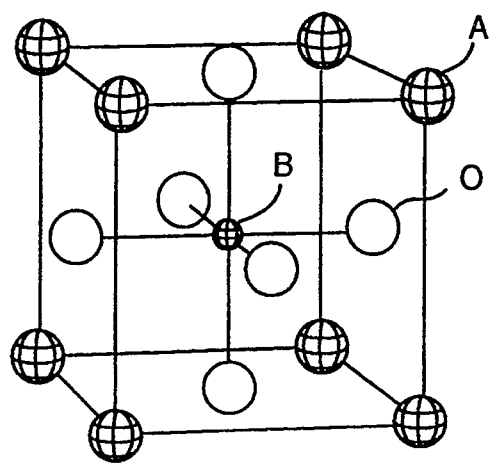
FIG. 5 is a diagram showing a crystal structure of a perovskite oxide used for an insulating film of the storage capacitor of FIG. 4.

Referring to FIG. 5, the perovskite oxide has a cubic crystal structure comprising A (a large cation), B (a small cation) and O (oxygen), generally expressed by a formula $ABO_3$. Elements corresponding to A include Sr, Ba, Pb, Ca, La and Nd, and elements corresponding to B include Ti, Zr, V, Bi, Co and Ir.

The relative dielectric constant of such a perovskite oxide is significantly high. Therefore, a sufficient capacitance can be secured even if the insulating film 5 is thickened as far as the insulation property thereof is not affected, thus preventing leakage current. The same effect can be obtained when a solid solution of a plurality of perovskite oxides is used instead of a single perovskite oxide.

Figure 4:
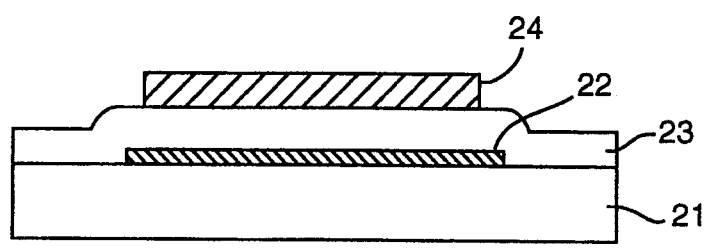
FIG. 4 is a diagrammatic sectional view of a storage capacitor of the active matrix substrate, a main part of the present invention.

A model of the storage capacitor having the structure shown in FIG. 4 was manufactured using a solid solution of a plurality of perovskite oxides for the insulating film, so as to measure the relative dielectric constant of the insulating film 5. The storage capacitor comprises an insulating substrate 21 made of quartz or Si covered with an insulating film, which corresponds to the insulating substrate 1. A lower electrode 22 which corresponds to the projection 3a of the gate bus 3, one of the pair of electrodes, was formed on a certain portion of the insulating substrate 21. The lower electrode 22 was formed, for example, by depositing Pd to a thickness of 1,000 Å by DC magnetron sputtering and then by patterning to the electrode.

Then, the substrate 21 and the lower electrode 22 were covered with an insulating film 23, which corresponds to the insulating film 5. For the insulating film 23, a solid solution of two perovskite oxides, $BaTiO_3$ and $SrTiO_3$, expressed by a formula $BaSrTiO_3$, was used. The insulating film 23 was formed by depositing $BaSrTiO_3$ to a thickness of 2,000 Å on the substrate 21 having a temperature of 600° C. by radio-frequency magnetron sputtering using the powder of the composition $Ba_{0.5}Sr_{0.5}TiO_3$ sintered at 900° C. as a target.

Then, an upper electrode 24 which corresponds to the pixel electrode 10 was formed on the insulating film 23. The upper electrode 24 was formed, for example, by depositing ITO (indium tin oxide) to a thickness of 1,000 Å by radio-frequency magnetron sputtering.

The relative dielectric constant $\epsilon$ of the thus formed storage capacitor was measured, and the result was about 860. Further, the insulating properties with regard to the leakage current and the withstand pressure were observed, and favorable results were obtained. It was found, therefore, that when the insulating film made of BaSrTiO$_3$ was used a significantly high relative dielectric constant could be obtained.

A single perovskite oxide such as BaTiO$_3$ or SrTiO$_3$ can also be used individually for the insulating film 23. The relative dielectric constant $\epsilon$ of the film 23. The relative dielectric constant $\epsilon$ of the storage capacitors both in the cases of using BaTiO$_3$ alone and SrTiO$_3$ alone was about 250, proving that the use of the single perovskite oxide can significantly improve the relative dielectric constant compared with the case of using the conventional material such as Al$_2$O$_3$ and Ta$_2$O$_5$. Furthermore, it was proved that the relative dielectric constant could be further improved when a solid solution of a plurality of perovskite oxides was used. For example, when a solid solution expressed by a formula Ba$_{(1-x)}$Sr$_x$TiO$_3$ was used and specifically X was 0.3 to 0.6 inclusive, a relative dielectric constant $\epsilon$ of about 480 to 860 was obtained, as shown in the above example in which X was 0.5 to obtain the composition Ba$_{0.5}$Sr$_{0.5}$TiO$_3$.

Accordingly, in the active matrix substrate of this example, the storage capacitor 12 is ensured to have a sufficient capacitance though the area thereof is small compared with conventional ones. Because of this enhanced capacitance per unit area, the aperture of the light shield film formed on the counter substrate which is overlaid on the active matrix substrate so as to complete the liquid crystal display device can be on the same level as, or higher than before so as to have a high precision display.

In the above model of the storage capacitor shown in FIG. 4, Pd was used for the lower electrode 22 corresponding to the gate bus 3. However, any conductive material such as Pt can be used for the gate bus 3. Also, though the lower electrode 22 was formed by DC magnetron sputtering in the above model, evaporation.

The insulating film 23 of the above model corresponding to the insulating film 5 was formed by radio-frequency magnetron sputtering, but the insulating film 5 can be formed by other thin film deposition methods such as evaporation and CVD.

In this example, the pixel electrode 10 and the gate bus 3 constitute the pair of electrodes for the storage capacitor. However, an electrode can be additionally provided to serve as one of the pair of electrodes instead of the pixel electrode 10, while the gate bus 3 serves as the other electrode. Alternatively, an additional electrode may serve as one of the pair of electrodes instead of the gate bus 3, while the pixel electrode 10 serves as the other electrode, or both of the pair of electrodes can be newly formed. However, in these alternative cases, a larger area must be covered with the light shield film, compared with the case of this example, which is disadvantageous in achieving a high precision display.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An active matrix substrate comprising thin film transistors and storage capacitors arranged in a matrix,
    wherein each of the storage capacitors includes a pair of electrodes facing each other and an insulating film interposed therebetween, one of the pair of electrodes being connected to one of said thin film transistors, and
    wherein the insulating film is a perovskite oxide expressed by a formula ABO$_3$ where A is selected from a group of Sr, Ba, Pb, Ca, La and Nd, B is selected from a group of Ti, Zr, V. Bi, Co and Ir, and O is oxygen, and said insulating film is a thin film deposit.

2. An active matrix substrate according to claim 1, wherein the insulating film is formed by a radio-frequency magnetron sputtering, evaporation or CVD method.

3. An active matrix substrate according to claim 1, wherein one of the pair of electrodes is a pixel electrode and the other is a gate bus.

4. An active matrix substrate comprising thin film transistors and storage capacitors arranged in a matrix,
    wherein each of the storage capacitors includes a pair of electrodes facing each other and an insulating film interposed therebetween, one of the pair of electrodes being connected to one of said thin film transistors, and
    wherein the insulating film is a solid solution deposit composed of a perovskite oxide expressed by a formula ABO$_3$ where A is selected from a group of Sr, Ba, Pb, Ca, La and Nd, B is selected from a group of Ti, Zr, V, Bi, Co and Ir, and O is oxygen.

5. An active matrix substrate according to claim 4, wherein the solid solution is a composition expressed by a formula Ba$_{(1-x)}$Sr$_x$TiO$_3$ where X is 0.3 to 0.6 inclusive.

6. An active matrix substrate according to claim 4, wherein the insulating film is formed by a radio-frequency magnetron sputtering, evaporation or CVD method.

7. An active matrix substrate according to claim 4, wherein one of the pair of electrodes is a pixel electrode and the other is a gate bus.

* * * * *